United States Patent
Kado et al.

(10) Patent No.: US 10,439,296 B2
(45) Date of Patent: Oct. 8, 2019

(54) ANTENNA DEVICE

(71) Applicant: Hitachi Metals, Ltd., Tokyo (JP)

(72) Inventors: Seiji Kado, Tokyo (JP); Tomoyuki Ogawa, Tokyo (JP); Satoshi Yoshihara, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 92 days.

(21) Appl. No.: 15/869,873

(22) Filed: Jan. 12, 2018

(65) Prior Publication Data

US 2018/0212335 A1 Jul. 26, 2018

(30) Foreign Application Priority Data

Jan. 25, 2017 (JP) ................. 2017-011237

(51) Int. Cl.
| | | |
|---|---|---|
| H01Q 1/24 | (2006.01) | |
| H01Q 1/38 | (2006.01) | |
| H01Q 21/00 | (2006.01) | |
| H01Q 1/48 | (2006.01) | |
| H01Q 1/12 | (2006.01) | |
| H01Q 3/30 | (2006.01) | |
| H01P 1/18 | (2006.01) | |
| H01Q 3/32 | (2006.01) | |
| H01Q 19/10 | (2006.01) | |
| H05K 3/36 | (2006.01) | |

(52) U.S. Cl.
CPC ......... *H01Q 21/0075* (2013.01); *H01P 1/184* (2013.01); *H01Q 1/12* (2013.01); *H01Q 1/24* (2013.01); *H01Q 1/246* (2013.01); *H01Q 1/48* (2013.01); *H01Q 3/30* (2013.01); *H01Q 3/32* (2013.01); *H01Q 19/10* (2013.01); *H05K 3/368* (2013.01); *H05K 2201/10098* (2013.01)

(58) Field of Classification Search
CPC ................. H01Q 19/10; H01Q 1/12; H01Q 1/48; H01Q 21/00; H01Q 21/0006; H01Q 21/0075; H01Q 3/30
See application file for complete search history.

(56) References Cited

U.S. PATENT DOCUMENTS

| | | | | |
|---|---|---|---|---|
| 5,909,195 A | * | 6/1999 | Merenda ................. | H01Q 9/26 343/815 |
| 6,947,008 B2 | * | 9/2005 | Tillery .................. | H01Q 1/085 343/824 |
| 7,027,005 B1 | * | 4/2006 | Chien .................... | H01Q 1/246 343/795 |
| 7,253,773 B2 | * | 8/2007 | Chiba ................... | H01Q 1/244 343/702 |

(Continued)

FOREIGN PATENT DOCUMENTS

JP 2014-236456 A 12/2014

*Primary Examiner* — Tho G Phan
(74) *Attorney, Agent, or Firm* — McGinn IP Law Group, PLLC.

(57) ABSTRACT

An antenna device includes a plurality of antenna elements, a metal member integrally including a first wall and a plurality of second walls that are arranged in parallel to each other and perpendicularly extend from one surface of the first wall, and circuit boards that are respectively housed in substrate-housing spaces as gaps between the adjacent second walls and mount feeder circuits for feeding power to the plurality of antenna elements.

12 Claims, 7 Drawing Sheets

(56) References Cited

U.S. PATENT DOCUMENTS

| | | | | |
|---|---|---|---|---|
| 7,755,559 B2* | 7/2010 | Pakosz | .................. | H01Q 9/285 |
| | | | | 343/700 MS |
| 8,026,864 B2* | 9/2011 | Noro | ....................... | H01Q 1/24 |
| | | | | 343/700 MS |
| 8,836,587 B2* | 9/2014 | Darnell | ................. | H01Q 1/243 |
| | | | | 343/700 MS |
| 2010/0182213 A1* | 7/2010 | Obermaier | ............ | H01Q 1/246 |
| | | | | 343/817 |
| 2014/0361951 A1 | 12/2014 | Iso et al. | | |
| 2017/0288299 A1* | 10/2017 | Ikeda | ...................... | H01Q 1/52 |

* cited by examiner

ANTENNA DEVICE

The present application is based on Japanese patent application No. 2017-011237 filed on Jan. 25, 2017, the entire contents of which are incorporated herein by reference.

BACKGROUND OF THE INVENTION

1. Field of the Invention

The invention relates to an antenna device.

2. Description of the Related Art

JP 2014/236456 A discloses an antenna device in which a feeder circuit is divided into first to third triplate lines and the second and third triplate lines are arranged orthogonal to the first triplate line.

SUMMARY OF THE INVENTION

The antenna device disclosed by JP 2014/236456 A is configured by combining the triplate lines. This causes an increase in the number of parts and screw fixing positions and, therefore, a problem may arise that it takes time and labor to assemble the antenna device. In more detail, the manufacture of the antenna device disclosed by JP 2014/236456 A may need to couple ground conductors of each triplate line by bolts and to provide many spacers to maintain the constant distance between the ground conductors, so that it takes time for assembly work. Thus, an antenna device that is configured to allow easy assembly thereof has been desired so as to reduce the manufacturing cost.

It is an object of the invention to provide an antenna device that is configured to allow easy assembly thereof.

According to an embodiment of the invention, an antenna device comprises:

a plurality of antenna elements;

a metal member integrally comprising a first wall and a plurality of second walls that are arranged in parallel to each other and perpendicularly extend from one surface of the first wall; and circuit boards that are respectively housed in substrate-housing spaces as gaps between the adjacent second walls and mount feeder circuits for feeding power to the plurality of antenna elements.

Effect of the Invention

According to an embodiment of the invention, an antenna device can be provided that is configured to allow easy assembly thereof.

BRIEF DESCRIPTION OF THE DRAWINGS

Next, the present invention will be explained in more detail in conjunction with appended drawings, wherein:

FIGS. 1A and 1B are schematic configuration diagrams illustrating an antenna device in an embodiment of the present invention, wherein FIG. 1A is a front view and FIG. 1B is a back view;

FIGS. 5A to 5D are diagrams illustrating an example of the circuit board, wherein FIG. 5A is a plan view, FIG. 5B is a top view, FIG. 5C is a cross sectional view taken on line A-A of FIG. 5A and FIG. 5D is a cross sectional view taken on line B-B of FIG. 5A;

FIGS. 7A and 7B are diagrams illustrating an antenna device in a modification of the invention, wherein FIG. 7A is a cross sectional view and FIG. 7B is an enlarged view showing a portion C in FIG. 7A.

DETAILED DESCRIPTION OF THE PREFERRED EMBODIMENTS

Embodiment

An embodiment of an antenna device of the invention will be described below in reference to FIGS. 1A to 7B. An antenna device 1 is used as an antenna for mobile phone base station. In the following description, an example in which the antenna device 1 in the present embodiment is used to send high-frequency signals will be described. However, the antenna device 1 can be used to receive signals.

General Configuration of the Antenna Device 1

Figure 1A:
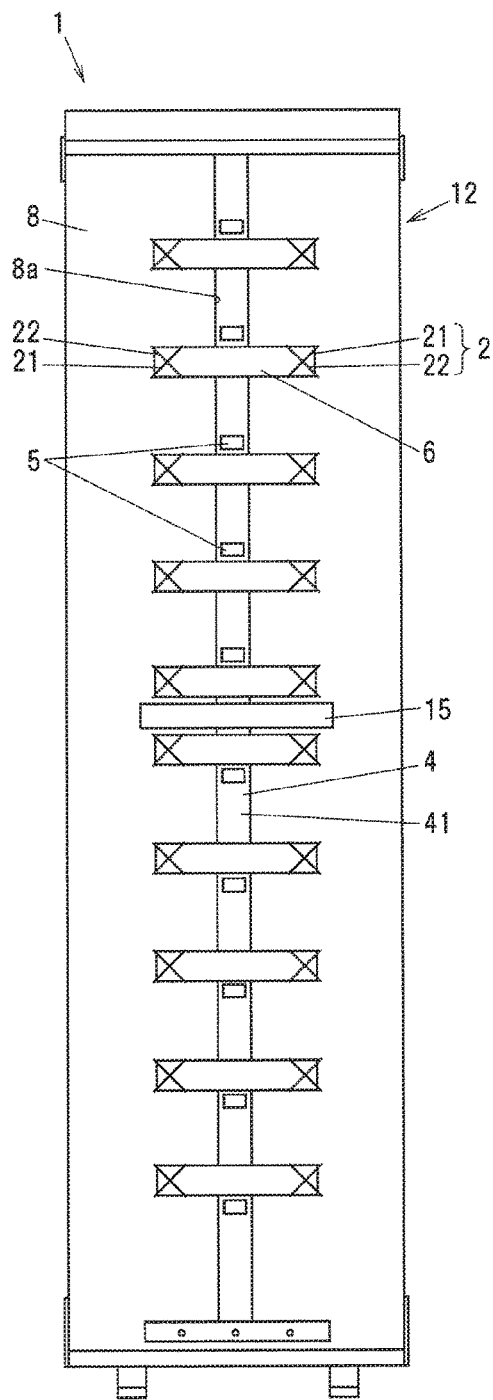
Figure 1B:
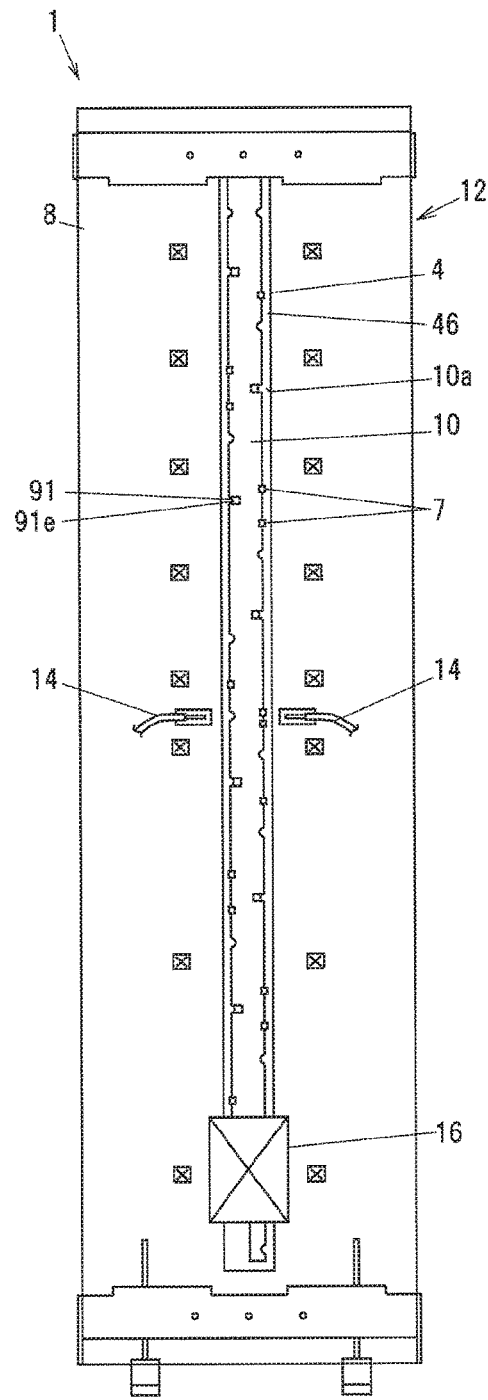
Figure 2:
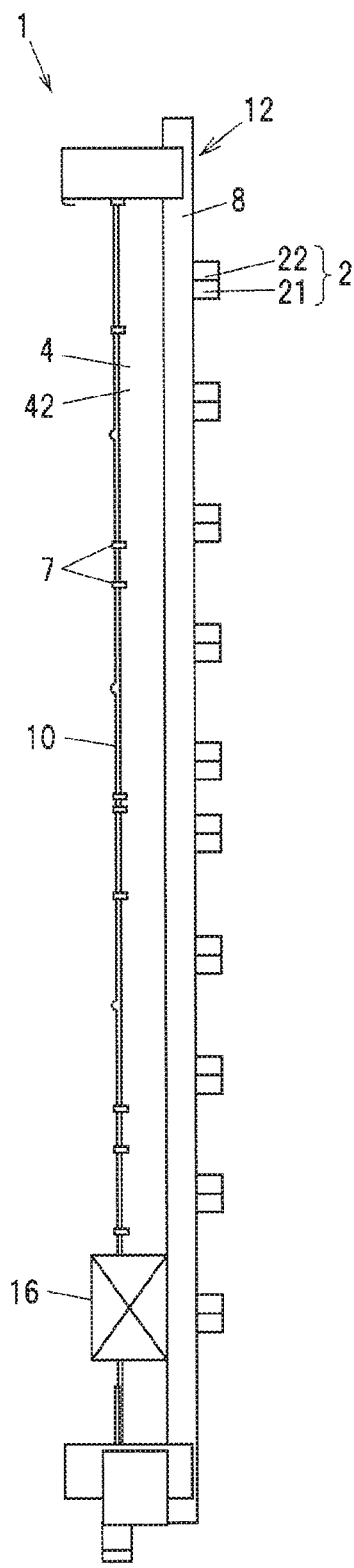
FIG. 2 is a side view showing the antenna device of FIGS. 1A and 1B.

FIGS. 1A and 1B are schematic configuration diagrams illustrating an antenna device in the present embodiment, wherein FIG. 1A is a front view and FIG. 1B is a back view. FIG. 2 is a side view thereof.

As shown in FIGS. 1A to 2, the antenna device 1 is provided with plural antenna elements 2, circuit boards 3 mounting feeder circuits for feeding power to the plural antenna elements 2, and a metal member 4 housing the circuit boards 3. The antenna device 1 in the present embodiment is configured that the circuit boards 3 mounting feeder circuits for feeding power to the antenna elements 2 are mounted on the metal member 4 having a comb-tooth-shaped cross section.

The antenna element 2 used in this example is a pair of a first antenna element 21 radiating a wave polarized at +45° with respect to the horizontal direction and a second antenna element 22 radiating a wave polarized at −45° with respect to the horizontal direction, which are combined in an X-shape manner. The first and second antenna elements 21 and 22 are vertically aligned in two rows. Although twenty each (ten for each row) of the first antenna element 21 and the second antenna element 22 are provided in this example, the number of elements is not limited thereto. In addition, arrangement of both antenna elements 21 and 22 is not limited to that shown in the drawings and, for example, the antenna elements 21 and 22 may be vertically aligned in a row. The antenna device 1 is provided with two feeder circuits, one is a feeder circuit for feeding power to the first antenna elements 21 and another is a feeder circuit for feeding power to the second antenna elements 22.

Feeder coaxial cables 14 are shown in FIG. 1B. In the present embodiment, two coaxial cables 14 corresponding to the number of feeder circuits are provided. The coaxial cables 14 are electrically connected to the circuit boards 3 via a cable connection board 15.

The antenna elements 2, the circuit boards 3 and the metal member 4 are housed in a cylindrical radome even though it is not illustrated. The antenna device 1 can send high-frequency signals having a bandwidth of, e.g., 1.8 to 2.1 GHz.

Description of the Metal Member 4

Figure 3A:
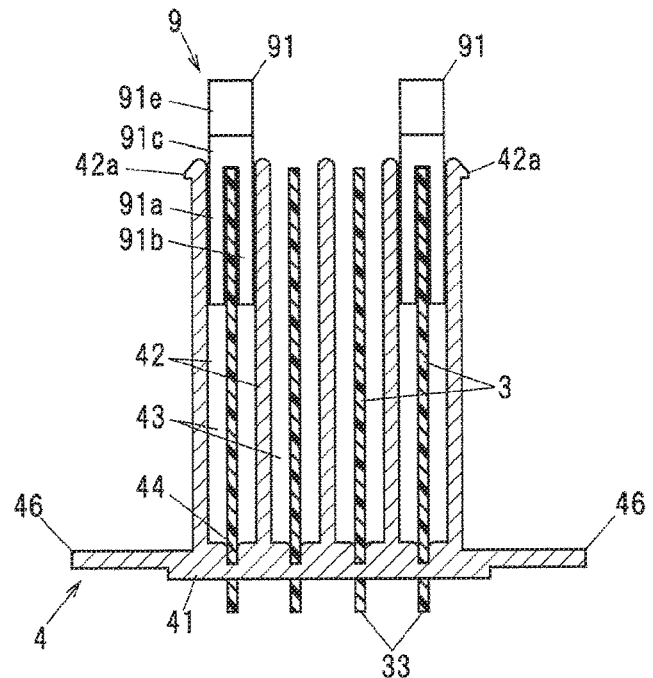
FIG. 3A is a cross sectional view showing a metal member mounting circuit boards.
Figure 3B:
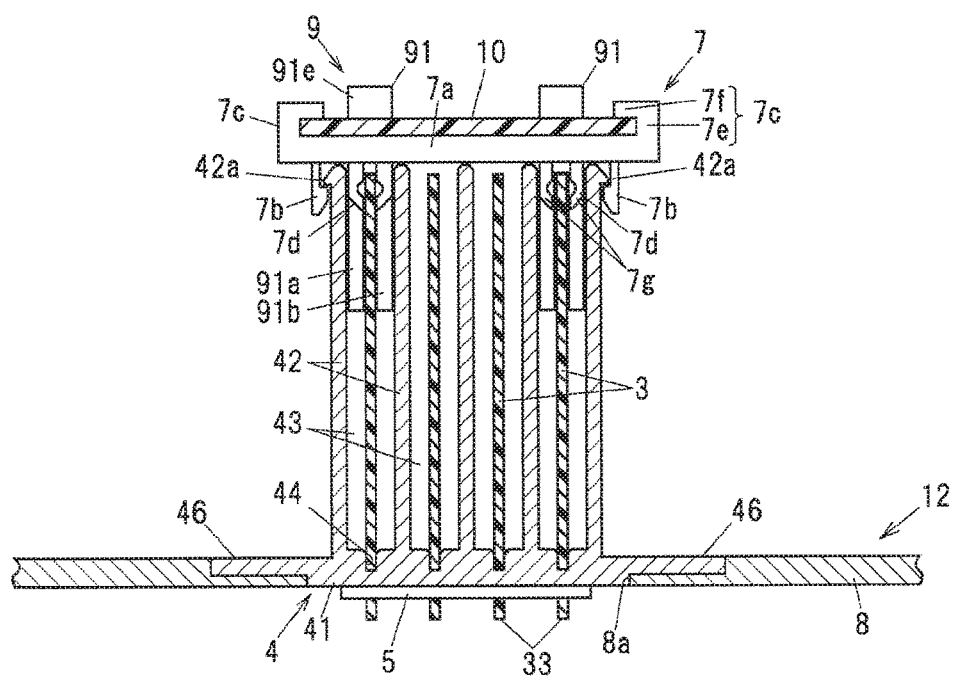
FIG. 3B is a cross sectional view when the metal member is fitted to a metal plate a holding member, and a slide member and an interlayer connection board are further attached.
Figure 4:
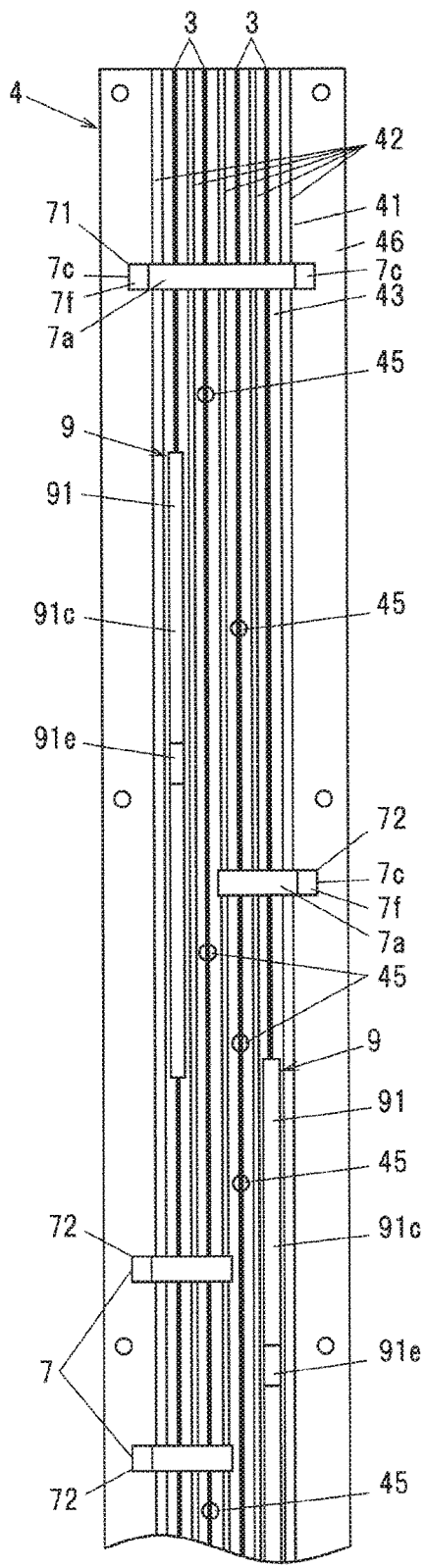
FIG. 4 is a plan view showing the metal member mounting the circuit boards and the holding members.

FIG. 3A is a cross sectional view showing the metal member 4 mounting the circuit boards 3 and FIG. 3B is a cross sectional view when the metal member 4 is fitted to a metal plate 8, and a holding member 7, a slide member 10 and an interlayer connection board 5 are further attached. FIG. 4 is a plan view showing the metal member 4 mounting the circuit boards 3 and the holding members 7.

As shown in FIGS. 1A to 4, the metal member 4 integrally has a first wall 41 and plural second walls 42 which are arranged in parallel to each other and perpendicularly extend from one surface of the first wall 41. Both the first wall 41 and the plural second walls 42 are formed in a plate shape. In other words, the metal member 4 is configured that end portions of the plural second walls 42 are joined to the one surface of the first wall 41. In the present embodiment, five second walls 42 are arranged at equal intervals.

The metal member 4 is formed of aluminum or an aluminum alloy and is shaped by a drawing process. Thus, assembly work of the antenna device 1 is simplified as compared to, e.g., when the first wall 41 and the second walls 42 are separately formed and fixed by bolts. The metal member 4 is formed horizontally symmetric (symmetric with respect to the center of the alignment direction of the second walls 42) so that unintentional bending, etc., is less likely to occur during the drawing process.

In the antenna device 1, the circuit boards 3 are housed in substrate-housing spaces 43 which are gaps formed between adjacent second walls 42. In the present embodiment, five second walls 42 are provided and four substrate-housing spaces 43 are thus formed. Each circuit board 3 is located at equal distances from adjacent second walls 42.

In the present embodiment, edges of the circuit boards 3 are inserted into substrate-holding grooves 44 formed on the one surface of the first wall 41 which is a surface facing the substrate-housing spaces 43, and the circuit boards 3 are thereby held by the metal member 4. The substrate-holding grooves 44 are formed linearly and parallel to the second walls 42 and each located in the middle between two facing second walls 42. By having the substrate-holding grooves 44, it is possible to easily align the circuit boards 3 and the antenna device 1 is assembled more easily.

In the drawing process, a formable size is limited, and a protruding length of the second walls 42 from the first wall 41 is thus limited. For this reason, in the present embodiment, each of two feeder circuits is dividedly mounted on the plural circuit boards 3. In addition, the circuit boards 3 mounting the same feeder circuit are housed in two adjacent substrate-housing spaces 43. In the antenna device 1, the plural circuit boards 3 separately housed in the substrate-housing spaces 43 (the circuit boards 3 mounting the same feeder circuit) are electrically connected to each other by the interlayer connection boards 5. The details of the interlayer connection board 5 will be described later.

The first wall 41 has plural through-holes 45 (see FIG. 4) which are formed to penetrate the first wall 41 and are provided for insertion of connection portions 33 of the circuit boards 3 (described later). The circuit boards 3 are electrically connected to the interlayer connection boards 5 via the through-holes 45. The circuit boards 3 are also connected to antenna connection boards 6 (which are described later) via the through-holes 45.

The first wall 41 integrally has flange portions 46 for connection to the metal plate 8 (described later). The flange portions 46 are integrally formed so as to laterally protrude from both sides of the first wall 41 and to be continuous with the one surface of the first wall 41 (the surface from which the second walls 42 extend). The flange portions 46 are thinner than other portion of the first wall 41, and level differences are thus formed on both sides of the first wall 41 (between the flange portions 46 and the other portion of the first wall 41).

Meanwhile, a locking pawl 42a for locking the holding members 7 (described later) is formed at the top edge (an edge opposite to the first wall 41) of each of the two outermost second walls 42. The locking pawl 42a is formed to protrude outward from the outer surface of the outermost second wall 42.

Description of the Circuit Board 3

Figure 5A:
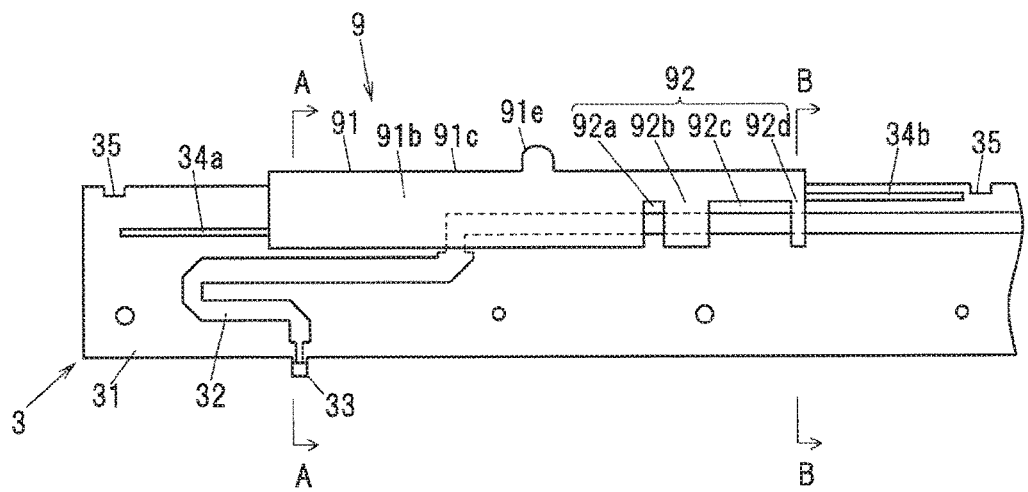
Figure 5B:
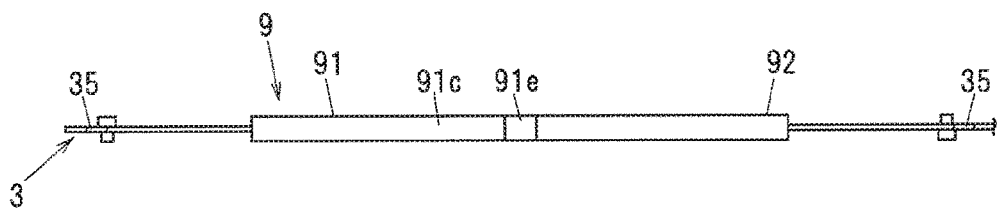
Figure 5C:
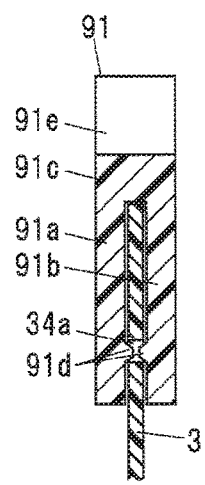
Figure 5D:
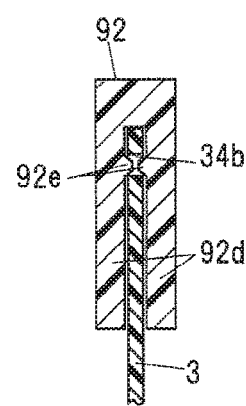

FIGS. 5A to 5D are diagrams illustrating an example of the circuit board 3, wherein FIG. 5A is a plan view, FIG. 5B is a top view, FIG. 5C is a cross sectional view taken on line A-A of FIG. 5A and FIG. 5D is a cross sectional view taken on line B-B of FIG. 5A.

The circuit board 3 is configured that wiring patterns 32 to be power feed lines are formed on both surfaces of a dielectric substrate 31. The wiring patterns 32 on the both surfaces of the circuit board 3 have the same shape when viewed from a thickness direction of the dielectric substrate 31 (the wiring patterns symmetric with respect to the center of the dielectric substrate 31 in the thickness direction). The wiring patterns 32 formed on the front and back surface of the dielectric substrate 31 may be electrically connected to each other via a through-hole penetrating the dielectric substrate 31.

The circuit board 3 is housed in the substrate-housing space 43 and is sandwiched by the second walls 42. Since the metal member 4 is grounded and serves as a ground conductor, a feeder circuit of a triplate structure in which the circuit board 3 is sandwiched by two ground conductors is realized.

Edges of the circuit boards 3 are inserted into the substrate-holding grooves 44 and the circuit boards 3 are thereby aligned with respect to the second walls 42 which serve as ground conductors. The connection portions 33 having a protrusion shape are provided at edges of the circuit boards 3 and stick out from the other surface of the first wall 41 (on the opposite side to the second walls 42) through the through-holes 45. The connection portions 33 are electrically connected to the interlayer connection boards 5 and the antenna connection boards 6.

Rectangular notches 35 are formed on edges of the circuit boards 3 on the opposite side to the first wall 41, and the holding members 7 (described later) are locked to the notches 35. The circuit boards 3 are restricted from moving relative to the holding members 7 in a length direction (a vertical direction; a direction parallel to the surface of the first wall 41 as well as to the surfaces of the second walls 42)

by fitting the holding members 7 to the notches 35, thereby preventing misalignment of the circuit boards 3.

Description of Phase Shifter

The feeder circuit mounted on the circuit boards 3 has plural phase shifters 9 for adjusting the phase of power fed to each antenna element 2 and also adjusting an electrical tilt angle of a beam emitted.

In the present embodiment, each phase shifter 9 has a dielectric member 91 which has a squared U-shaped cross section and is provided to sandwich an edge of the circuit board 3 on the opposite side to the first wall 41. The dielectric member 91 integrally has a first dielectric portion 91a facing the wiring pattern 32 formed on one surface of the circuit board 3, a second dielectric portion 91b facing the wiring pattern 32 formed on the other surface of the circuit board 3, and a coupling portion 91c coupling between the first and second dielectric portions 91a and 91b. The first and second dielectric portions 91a and 91b are formed in a plate shape parallel to circuit board 3, and the coupling portion 91c is formed in a plate shape orthogonal to the first and second dielectric portions 91a and 91b.

The dielectric member 91 is provided slidable along an edge of the circuit board 3. Along with a slide travel of the dielectric member 91, an area where the wiring patterns 32 face the dielectric member 91 changes and the phase shift amount thus changes. Hereinafter, a travel direction of the dielectric member 91 is referred to as a length direction. The length direction is a direction parallel to the surface of the first wall 41 and the surfaces of the second walls 42 of the metal member 4.

At an end of the dielectric member 91 on the signal input side, a transformer portion 92 is arranged to provide impedance matching between a portion of the wiring pattern 32 facing the dielectric member 91 and a portion of the wiring pattern 32 not facing the dielectric member 91. The wiring pattern 32 on the signal input side is linearly formed along the slide direction of the dielectric member 91 (the length direction), and the transformer portion 92 is always located at the end of the dielectric member 91 on the signal input side regardless of the slide position of the dielectric member 91.

The transformer portion 92 in the present embodiment is formed by providing two through-holes spaced in the length direction so that high-impedance portions 92a and 92c formed due to the through-holes and low-impedance portions 92b and 92d without through-holes are arranged alternately. However, the specific configuration of the transformer portion 92 is not specifically limited. In the transformer portion 92 of the present embodiment, a two-stage transformer is formed by arranging the second low-impedance portion 92d, the second high-impedance portion 92c, the first low-impedance portion 92b and the first high-impedance portion 92a in this order from the signal input side. In the present embodiment, an area where the dielectric member 91 on the signal input side with respect to the first high-impedance portion 92a (i.e., the first and second dielectric portions 91a and 91b) overlaps the wiring patterns 32 contributes to adjustment of the phase shift amount.

The transformer portion 92 is configured that characteristic impedance of the transformer portion 92 is adjusted by adjusting the lengths of the high-impedance portions 92a, 92c and the low-impedance portions 92b, 92d and impedance matching is thereby achieved. Such configuration allows the transformer portion 92 to have a shorter length than, e.g., when using a 214 transformer and thus contributes to size reduction of the phase shifter 9. The transformer portion 92 has a two-stage configuration in the present embodiment but may have a single-stage configuration.

The circuit board 3 has a linear guide groove 34a formed to extend along the length direction and to penetrate the circuit board 3, and a guide protrusion 91d protruding into the guide groove 34a is formed on each of the first and second dielectric portions 91a and 91b of the dielectric member 91. The circuit board 3 also has a linear guide groove 34b formed to extend along the length direction and to penetrate the circuit board 3, and guide protrusion 92e protruding into the guide groove 34b are formed on the second low-impedance portion 92d of the transformer portion 92. The dielectric member 91 (including the transformer portion 92) is prevented from coming off from the circuit board 3 by contact of the guide protrusions 91d and 92e with the dielectric substrate 31 at the periphery of the guide grooves 34a and 34b. In the present embodiment, since the guide protrusions 91d and 92e of the dielectric member 91 (and the corresponding guide grooves 34a and 34b) are respectively provided at both ends in the length direction, tilting of the dielectric member 91 (one end lifted up) is prevented.

The antenna device 1 also has a mechanism to slide plural dielectric members 91 in an interlocking manner. In detail, the phase shifter 9 has the slide member 10 formed in a plate shape parallel to the first wall 41, arranged to face the first wall 41 with the second walls 42 interposed therebetween and coupled to the plural dielectric members 91, and the holding members 7 each having a slide holding portion 7c for holding the slide member 10 so that the slide member 10 is slidable in the length direction (in a direction parallel to the surface of the first wall 41 and the surfaces of the second walls 42). The holding member 7 is formed of an insulating resin. The slide member 10 is formed of a resin in the present embodiment but may be formed of, e.g., a metal. The material of the slide member 10 is not specifically limited.

In the present embodiment, each dielectric member 91 has a coupling protrusion 91e protruding from the middle of the coupling portion 91c in the length direction toward the side opposite to the first wall 41, and the slide member 10 has coupling cutouts 10a into which the coupling protrusions 91e are inserted. The dielectric members 91 are coupled to the slide member 10 by inserting the coupling protrusions 91e into the coupling cutouts 10a, and the dielectric members 91 slide with a slide travel of the slide member 10. An end portion of the slide member 10 is connected to an actuator 16 which has a DC motor, etc., for sliding the slide member 10 (see FIGS. 1B and 2).

The holding member 7 integrally has a bar-shaped base portion 7a, a lance-shaped metal member-locking portion(s) 7b extending from the base portion 7a toward the first wall 41 and engaged with the locking pawl(s) 42a of the second wall(s) 42 to fix the holding member 7 to the metal member 4, a slide holding portion(s) 7c protruding from an edge(s) of the base portion 7a toward the side opposite to the metal member 4 and slidably holding the slide member 10, and substrate-holding portions 7d extending inside the substrate-housing spaces 43 from the base portion 7a and holding edges of the circuit boards 3 on the opposite side to the first wall 41.

The slide holding portion 7c has a substantially F-shape and integrally has a vertical portion 7e extending from an end portion of the base portion 7a toward the side opposite to the metal member 4, and a horizontal portion 7f extending inward from a tip portion of the vertical portion 7e in the alignment direction of the second walls 42. The slide member 10 is inserted between the horizontal portions 7f and the base portions 7a, and is thereby slidably held by the holding members 7.

The substrate-holding portion 7d has two protrusions 7g which sandwich the circuit board 3. The protrusion 7g on the metal member-locking portion 7b side serves, together with the metal member-locking portion 7b, to sandwich the second wall 42.

As such, the holding member 7 is a member which serves to hold the slide member 10 and also serves to hold the circuit board 3. A member for holding the slide member 10 and a member for holding the circuit board 3 may be provided separately, but in this case, the number of components increases. By using the holding member 7 having both the slide holding portion 7c and the substrate-holding portion 7d as is in the present embodiment, it is possible to reduce the number of components and possible to assemble the antenna device 1 more easily.

In the present embodiment, two types of holding member are used; one is a first holding member 71 having the metal member-locking portions 7b and the slide holding portions 7c at both end portions of the base portion 7a and locked to the two outermost second walls 42, and another is a second holding member 72 having the metal member-locking portion 7b and the slide holding portion 7c at only one end portion of the base portion 7a and locked to only one of the two outermost second walls 42, and these two types of the holding members 7 (71 and 72) are combined differently depending on arrangement of the circuit boards 3.

Description of Reflector

The antenna device 1 is provided with the metal plate 8 having a fitting hole 8a to which the first wall 41 of the metal member 4 is fitted. The metal plate 8 is formed of the same material as the metal member 4, i.e., formed of aluminum or an aluminum alloy. The flange portions 46 are fixed to the metal plate 8 at the periphery of the fitting hole 8a by bolts and the metal member 4 is thereby fixed to the metal plate 8.

The metal plate 8 is formed in a large area enough to cover the entire back surface of the antenna device 1 in the front view, and serves as a reflector 12. In the present embodiment, the first wall 41 of the metal member 4 closing the fitting hole 8a also serves as the reflector 12. In other words, in the antenna device 1, the reflector 12 has the first wall 41 of the metal member 4 and the metal plate 8 having the fitting hole 8a for fitting the first wall 41, and is formed by fitting the first wall 41 to the fitting hole 8a.

Description of the Interlayer Connection Board 5 and the Antenna Connection Board 6

The interlayer connection boards 5 are provided to electrically connect between the circuit boards 3 which mount the same feeder circuit and are separately housed in the substrate-housing spaces 43. The interlayer connection boards 5 are arranged on the other surface of the first wall 41 (on the opposite side to the second walls 42) and are electrically connected, via the through-holes 45, to the circuit boards 3 housed in the substrate-housing spaces 43.

Figure 6A:
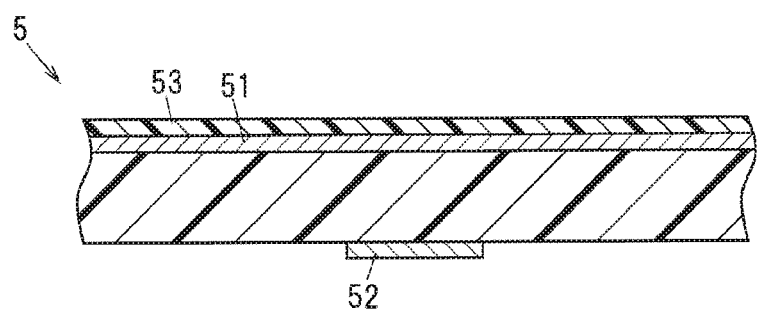
FIG. 6A is a schematic cross-sectional view showing the interlayer connection board.

As shown in FIG. 6A, the interlayer connection board 5 has a ground pattern 51 on a surface on the first wall 41 side and a wiring pattern 52 to be a part of power feed line formed on a surface opposite to the first wall 41. That is, a microstrip line is formed as a transmission line in the interlayer connection board 5.

In the present embodiment, the interlayer connection board 5 further has an insulating resist layer 53 formed to cover the ground pattern 51. The interlayer connection board 5 is fixed to the metal member 4 in a state that a surface of the resist layer 53 is in contact with the first wall 41.

The ground pattern 51 could be arranged directly in contact with the first wall 41 as a ground conductor for providing electrical conduction. However, it was found as a result of study by the present inventors that intermodulation (IM) distortion in such a case increases at higher power output, leading to characteristic degradation. Thus, in the present embodiment, the ground pattern 51 is electromagnetically coupled to the first wall 41 with the insulating resist layer 53 interposed therebetween. As a result, the ground pattern 51 and the first wall 41 are galvanically isolated but electrically connected at high frequencies, and it is thus possible to prevent intermodulation distortion.

Figure 6B:
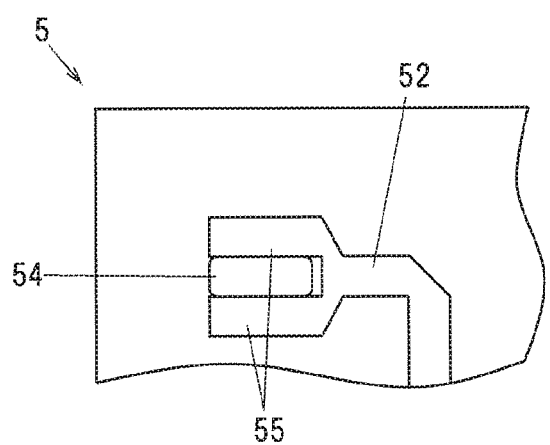
FIG. 6B is a plan view showing a connection portion of the interlayer connection board provided for connection to the circuit board.

The interlayer connection board 5 also has a substrate connecting through-hole 54 for insertion of the connection portion 33 of the circuit board 3 which extends from the through-hole 45 of the metal member 4, as shown in FIG. 6B. In the present embodiment, since the wiring patterns 32 are formed on both surfaces of the circuit board 3, a pair of pad portions 55 is formed so as to sandwich the substrate connecting through-hole 54. The both pad portions 55 are formed in the same shape so as to have the same potential. By inserting the connection portion 33 of the circuit board 3 through the substrate connecting through-hole 54 and soldering the wiring patterns 32 of the front and back surfaces respectively to the pad portions 55, the interlayer connection board 5 is electrically connected to the circuit board 3 and is also fixed to the metal member 4.

A wiring pattern 52 is connected to the pair of pad portions 55. In this regard, if the wiring structure is such that, e.g., the wiring pattern 52 is connected to one of the pad portions 55 which are electrically connected each other, the line length to the wiring pattern on the front and back surfaces of the circuit board 3 is different, and this difference causes a phase difference between signals flowing through the wiring patterns on the front and back surfaces of the circuit board 3. Therefore, in the present embodiment, the wiring pattern 52, which is connected to a rim of the substrate connecting through-hole 54 at a position located at equal distances from the pad portions 55, extends in a direction perpendicular to the facing direction of the pad portions 55.

As shown in FIG. 1A, the antenna connection boards 6 are arranged on the other surface side of the first wall 41 and are electrically connected to the circuit boards 3 through the through-holes 45 formed on the metal member 4, in the same manner as the interlayer connection board 5. The antenna elements 2 are mounted on the antenna connection boards 6, and the feeder circuits mounted on the circuit boards 3 are thus electrically connected to the antenna elements 2 via the antenna connection boards 6.

Although it is not shown in the drawings, the antenna connection board 6 has a ground pattern on a surface on the first wall 41 side, a wiring pattern to be a part of power feed line formed on a surface opposite to the first wall 41, and an insulating resist layer formed to cover the ground pattern, in the same manner as the interlayer connection board 5. The antenna connection board 6 is fixed to the first wall 41 in a state that a surface of the resist layer is in contact with the first wall 41. This prevents intermodulation distortion and it is thus possible to realize the antenna device 1 suitable for high power application such as mobile phone.

Assembly of the Antenna Device 1

To assemble the antenna device 1, the circuit boards 3 are firstly housed in the substrate-housing spaces 43 of the metal member 4. At this time, edges of the circuit boards 3 are inserted into the substrate-holding grooves 44 and the opposite edges are fixed by the holding members 7. After that, the slide member 10 is attached to the holding members 7 and is also coupled to the dielectric members 91 by inserting the coupling protrusions 91e of the dielectric members 91 into the coupling cutouts 10a of the slide member 10.

Then, the metal member 4 is attached to the metal plate 8. At this time, the first wall 41 is fitted to the fitting hole 8a and the flange portions 46 are fixed to the metal plate 8 by bolts, etc. After that, the actuator 16 is mounted on the metal plate 8 and connected to an end portion of the slide member 10, and the interlayer connection boards 5, the antenna connection boards 6 mounting the antenna elements 2 and the cable connection board 15 are connected to the connection portions 33 of the circuit boards 3 extending from the through-holes 45. After that, the coaxial cables 14 are connected to the cable connection board 15, the entire assembly is then housed in a radome, and the antenna device 1 is thereby obtained.

Functions and Effects of the Embodiment

As described above, the antenna device 1 in the present embodiment is provided with the plural antenna elements 2, the metal member 4 integrally having the first wall and the plural second walls 42 which are arranged in parallel to each other and perpendicularly extend from one surface of the first wall 41, and the circuit boards 3 which are respectively housed in the substrate-housing spaces 43 as gaps between the adjacent second walls 42 and mount the feeder circuits for feeding power to the plural antenna elements 2.

The structure in which the circuit boards 3 are housed in the substrate-housing spaces 43 of the integrally-formed metal member 4 facilitates assembly of the antenna device 1 and reduces the number of components as compared to a conventional structure formed by coupling triplate lines, hence, contributing to reduction in manufacturing time and cost.

In addition, in the antenna device 1, since the second walls 42 serving as the ground conductors are integrally coupled by the first wall 41 and electrical conduction between the second walls 42 is ensured, it is not necessary to attach metal columns, etc., to provide electrical conduction between the second walls 42 and assembly work is thus very easy.

Modifications

Although the reflector 12 in the present embodiment is formed by fitting the first wall 41 to the metal plate 8, the specific configuration of the reflector 12 is not limited thereto. For example, a ground pattern of a large substrate can be used as the reflector 12.

Figure 7A:
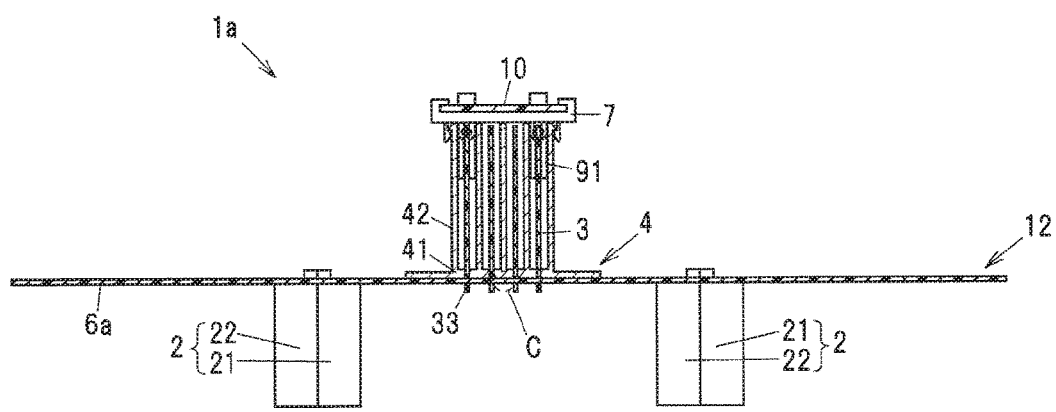
Figure 7B:
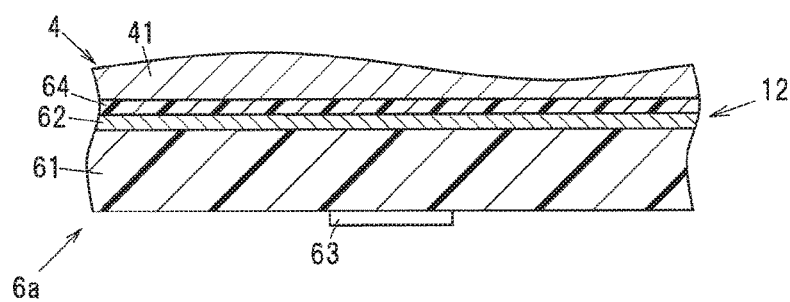

In detail, the configuration may be such that plural antenna elements 2 are mounted on a common large antenna connection board 6a and a ground pattern 62 to be the reflector 12 is formed on a surface of the antenna connection board 6a on the opposite side to the surface mounting the antenna elements 2, as is an antenna device 1a shown in FIGS. 7A and 7B. In this case, the antenna connection board 6a may also serve as the interlayer connection board 5. The antenna connection board 6a is configured such that the ground pattern 62 is formed on a surface of a substrate 61, a wiring pattern 63 to be a part of power feed line is formed on the other surface of the substrate 61, and a resist layer 64 is formed on the ground pattern 62. The metal member 4 is electromagnetically coupled to the ground pattern 62.

In addition, although the feeder circuits are provided such that each one is dividedly mounted on plural circuit boards 3 in the embodiment, the feeder circuits may be provided such that one feeder circuit is mounted on one circuit board 3 when, e.g., the number of the antenna elements 2 is small.

Furthermore, the dielectric member 91 having a squared U-shaped cross section is used in the embodiment, it is only necessary to provide dielectrics of the same shape so as to face each other while sandwiching the circuit board 3, and for example, two such dielectrics may be coupled by a coupling member such as pin.

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] An antenna device (1), comprising: a plurality of antenna elements (2); a metal member (4) integrally comprising a first wall (41) and a plurality of second walls (42) that are arranged in parallel to each other and perpendicularly extend from one surface of the first wall (41); and circuit boards (3) that are respectively housed in substrate-housing spaces (43) as gaps between the adjacent second walls (42) and mount feeder circuits for feeding power to the plurality of antenna elements (2).

[2] The antenna device (1) defined by [1], wherein the metal member (4) comprises substrate-holding grooves (44) formed on the one surface of the first wall (41) facing the substrate-housing spaces (43), and wherein the circuit boards (3) are held by the metal member (4) by inserting edges of the circuit boards (3) into the substrate-holding grooves (44).

[3] The antenna device (1) defined by [1] or [2], wherein the feeder circuits are dividedly mounted on the plurality of circuit boards (3), and wherein the antenna device (1) further comprises interlayer connection boards (5) that are arranged on the other surface side of the first wall (41) and electrically connect, via through-holes (45) formed on the first wall (41), between the plurality of circuit boards (3) separately housed in the substrate-housing spaces (43).

[4] The antenna device (1) defined by [3], wherein the interlayer connection board (5) comprises a ground pattern (51) formed on a surface on the first wall (41) side, a wiring pattern (52) formed on a surface opposite to the first wall (41) and serving as a portion of a power feed line, and an insulating resist layer (43) formed to cover the ground pattern (51).

[5] The antenna device (1) defined by any one of [1] to [4], further comprising antenna connection boards (6) that are arranged on the other surface side of the first wall (41), are electrically connected to the circuit boards (3) via the through-holes (45) formed on the first wall (41), and electrically connect the feeder circuits to the antenna elements (2).

[6] The antenna device (1) defined by [5], wherein the antenna connection board (6) comprises a ground pattern formed on a surface on the first wall (41) side, a wiring pattern formed on a surface opposite to the first wall (41) and serving as a portion of a power feed line, and an insulating resist layer formed to cover the ground pattern.

[7] The antenna device (1) defined by any one of [1] to [6], wherein the feeder circuit comprises a plurality of phase shifters (9), and wherein each of the phase shifters (9) comprises a dielectric member (91) having a squared U-shaped cross section and provided to sandwich an edge of the circuit board (3) on the opposite side to the first wall (41).

[8] The antenna device (1) defined by [7], further comprising: a slide member (10) that is formed in a plate shape parallel to the first wall (41), is arranged to face the first wall (41) with the second walls (42) interposed therebetween, and is coupled to the plurality of dielectric members (91); and holding members (7) that are attached to end portions of the second walls (42) on the opposite side to the first wall (41) and each comprise a slide holding portion (7c) for slidably holding the slide member (10) in a direction parallel to the surface of the first wall (41) and to the surfaces of the second walls (42).

[9] The antenna device (1) defined by [8], wherein each of the dielectric members (91) comprises a coupling protrusion (91e) protruding toward a side opposite to the first wall (41), wherein the slide member (10) comprises coupling cutouts (10a) for insertion of the coupling protrusions (91e), and wherein the dielectric members (91) are coupled to the slide member (10) by inserting the coupling protrusions (91e) into the coupling cutouts (10a).

[10] The antenna device (1) defined by [8] or [9], wherein the holding member (7) comprises substrate-holding portions (7d) for holding edges of the circuit boards (3) on the opposite side of the first wall (41).

[11] The antenna device (1) defined by any one of [1] to [10], further comprising a reflector (12) that comprises the first wall (41) of the metal member (4) and a metal plate (8) with a fitting hole (8a) for fitting the first wall (41) and is formed by fitting the first wall (41) to the fitting hole (8a).

[12] The antenna device (1) defined by any one of [1] to [11], wherein the plurality of antenna elements (2) are mounted on the common antenna connection board (6a), and wherein the antenna connection board (6a) comprises a ground pattern (62) to be a reflector (12) on a surface opposite to the surface mounting the antenna elements (12).

Although the embodiment of the invention has been described, the invention according to claims is not to be limited to the embodiment. Further, please note that all combinations of the features described in the embodiment are not necessary to solve the problem of the invention.

The invention can be appropriately modified and implemented without departing from the gist thereof.

What is claimed is:

1. An antenna device, comprising:
a plurality of antenna elements;
a metal member integrally comprising a first wall and a plurality of second walls that are arranged in parallel to each other and perpendicularly extend from one surface of the first wall; and
circuit boards that are respectively housed in substrate-housing spaces as gaps between the adjacent second walls and mount feeder circuits for feeding power to the plurality of antenna elements.

2. The antenna device according to claim 1, wherein the metal member comprises substrate-holding grooves formed on the one surface of the first wall facing the substrate-housing spaces, and
wherein the circuit boards are held by the metal member by inserting edges of the circuit boards into the substrate-holding grooves.

3. The antenna device according to claim 1, wherein the feeder circuit circuits are dividedly mounted on the plurality of circuit boards, and
wherein the antenna device further comprises interlayer connection boards that are arranged on the other surface side of the first wall and electrically connect, via through-holes formed on the first wall, between the plurality of circuit boards separately housed in the substrate-housing spaces.

4. The antenna device according to claim 3, wherein the interlayer connection board comprises a ground pattern formed on a surface on the first wall side, a wiring pattern formed on a surface opposite to the first wall and serving as a portion of a power feed line, and an insulating resist layer formed to cover the ground pattern.

5. The antenna device according to claim 1, further comprising antenna connection boards that are arranged on the other surface side of the first wall, are electrically connected to the circuit boards via the through-holes formed on the first wall, and electrically connect the feeder circuits to the antenna elements.

6. The antenna device according to claim 5, wherein the antenna connection board comprises a ground pattern formed on a surface on the first wall side, a wiring pattern formed on a surface opposite to the first wall and serving as a portion of a power feed line, and an insulating resist layer formed to cover the ground pattern.

7. The antenna device according to claim 1, wherein the feeder circuit comprises a plurality of phase shifters, and
wherein each of the phase shifters comprises a dielectric member having a squared U-shaped cross section and provided to sandwich an edge of the circuit board on the opposite side to the first wall.

8. The antenna device according to claim 7, further comprising:
a slide member that is formed in a plate shape parallel to the first wall, is arranged to face the first wall with the second walls interposed therebetween, and is coupled to the plurality of dielectric members; and
holding members that are attached to end portions of the second walls on the opposite side to the first wall and each comprise a slide holding portion for slidably holding the slide member in a direction parallel to the surface of the first wall and to the surfaces of the second walls.

9. The antenna device according to claim 8, wherein each of the dielectric members comprises a coupling protrusion protruding toward a side opposite to the first wall, and
wherein the slide member comprises coupling cutouts for insertion of the coupling protrusions, and
wherein the dielectric members are coupled to the slide member by inserting the coupling protrusions into the coupling cutouts.

10. The antenna device according to claim 8, wherein the holding member comprises substrate-holding portions for holding edges of the circuit boards on the opposite side of the first wall.

11. The antenna device according to claim 1, further comprising a reflector that comprises the first wall of the metal member and a metal plate with a fitting hole for fitting the first wall and is formed by fitting the first wall to the fitting hole.

12. The antenna device according to claim 1, wherein the plurality of antenna elements are mounted on the common antenna connection board, and
 wherein the antenna connection board comprises a ground pattern to be a reflector on a surface opposite to the surface mounting the antenna elements.

* * * * *